(12) United States Patent
Shirasaki

(10) Patent No.: US 8,356,849 B2
(45) Date of Patent: Jan. 22, 2013

(54) PELLICLE HANDLING TOOL

(75) Inventor: Toru Shirasaki, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/040,331

(22) Filed: Mar. 4, 2011

(65) Prior Publication Data
US 2011/0215602 A1 Sep. 8, 2011

(30) Foreign Application Priority Data

Mar. 5, 2010 (JP) ................................. 2010-048865

(51) Int. Cl.
*B66C 1/42* (2006.01)
(52) U.S. Cl. ..................... 294/119.1; 294/902
(58) Field of Classification Search ............... 294/119.1, 294/34, 213, 902; 414/941
See application file for complete search history.

(56) References Cited

U.S. PATENT DOCUMENTS

| | | | | |
|---|---|---|---|---|
| 2,226,789 | A * | 12/1940 | Tupy | 294/106 |
| 4,647,100 | A * | 3/1987 | Lessway | 294/119.1 |
| 6,039,375 | A * | 3/2000 | Bauman | 294/119.1 |
| 7,048,316 | B1 * | 5/2006 | Blank et al. | 294/213 |
| 7,520,545 | B2 * | 4/2009 | Kim | 294/213 |
| 2004/0086368 | A1 * | 5/2004 | Downs et al. | 414/741 |

FOREIGN PATENT DOCUMENTS

| | | | |
|---|---|---|---|
| DE | 3325921 A1 | * | 1/1985 |
| DE | 3806148 A1 | * | 9/1988 |
| JP | 2007 292995 | | 11/2007 |
| JP | 2007292995 A | * | 11/2007 |

OTHER PUBLICATIONS

Thomson Innovation, Record Patent Viewer, Publication Date: Feb. 8, 2012; English Abstract of JP-2007 292995.

* cited by examiner

*Primary Examiner* — Saul Rodriguez
*Assistant Examiner* — Gabriela Puig
(74) *Attorney, Agent, or Firm* — Millen, White, Zelano & Branigan, P.C.

(57) ABSTRACT

A handling tool for handling a pellicle which is used in the lithography carried out in a manufacturing process of semiconductor devices, comprising a handle, a main shaft connected with a fore-end of the handle to form a T-shaped part, two parallel arms protruding forward from the both ends of the said main shaft orthogonally to form a U-shaped part, and four pellicle frame holders of which two are each provided on the inward side surface of each arm respectively, wherein the arms are designed in a manner such that they are both capable of moving towards and away from each other so as to be able to adjust the arm-to-arm distance, and the said holders are provided so that they can grasp the frame's side surfaces at the four corners of the pellicle frame when the said arms are closed.

4 Claims, 5 Drawing Sheets

PRIOR ART

PELLICLE HANDLING TOOL

TECHNICAL FIELD

The present invention relates to a handling tool for handling a lithography pellicle used for a dust guard during manufacturing semiconductor devices such as LSI and VLSI, and in particular, relates to a pellicle handling tool which does not deform a pellicle frame.

BACKGROUND OF THE INVENTION

Conventionally, when semiconductor devices such as LSI and VLSI and liquid crystal display panels or the like are manufactured, the light is irradiated on photosensitive materials coated on semiconductor wafers or original panels for liquid crystal to form a pattern of photo-resist. In this case, if a dust adheres to a photo-mask used, this dust absorbs and reflects the light. Therefore, the pattern to be transcribed is sometimes deformed and the edge of a photo-resist is sometimes rough. For this reason, size, quality and appearance or the like of obtained products are damaged and the performance and the manufacture yield of semiconductor devices and liquid crystal display panels are decreased, which was a problem.

A patterning operation of the above photo-resist is generally carried out in a clean room. However, it is difficult to keep the photo-mask always clean even inside a clean room. Therefore, a pellicle used for exposure, which transmits the light well, is applied on the surface of the photo-mask so that the dust does not adhere to the photo-mask. Hereby, the dust does not adhere to the surface of the photo-mask directly, but adheres to the pellicle film, which has an advantage where effects of the dust on the pellicle on the patterning can be avoided by bringing the pattern on an original plate for exposure into focus when the light is irradiated.

A pellicle generally consists of a thin pellicle film, a frame made of aluminum, an adhesive agent for fixing the pellicle film to the frame and a tackiness agent for fixing the pellicle to the photo-mask. The above tackiness agent is covered by a separator, which is fixed when the pellicle is shipped, the said separator is taken off when the pellicle is used, and the pellicle is fixed to the mask by pressing the exposed tackiness agent of the pellicle to the photo-mask.

A pellicle, shipped from a pellicle maker in a state of being put in a pellicle case, is taken out from the case by a photo-mask maker and is applied to the photo-mask. A photo-mask for a semiconductor is generally 6 inch square, and a pellicle fixed to it is rectangular, having a long side of about 147-150 mm and a short side of about 110-125 mm (FIG. 1).

The photo-mask maker takes out the pellicle from the case, checks whether it can stand the test and applies it to the mask, then it is confirmed as acceptable. When handling this pellicle, in some cases, a handling operator handles it by hand. Namely, a handling operator opens the pellicle case with gloved hands, grabs the pellicle with gloved hands directly for inspection, then puts acceptable products into a pellicle mounter, and applies the pellicle 1 to the photo-mask 10 using the pellicle mounter (FIG. 1). On this occasion, there was a problem that the pellicle becomes dirty, in a high possibility, with the foreign substances, since the handling operator touches the pellicle directly.

On the other hand, the handling operator sometimes uses a handling tool like the one shown by FIG. 2 (Patent document 1) when he handles the pellicle. The arms 5 of both sides of this tool have the insertion pins 7, which work as the holding claws. The said arms 5 open and shut from left to right to grasp or release the pellicle. As for the grasped pellicle, generally, two holes 8 which receive the above insertion pins are provided in an each long side of the pellicle, so that the total 4 holes are provided. The handling tool holds the pellicle by inserting the above insertion pins 7 into these holes 8 (FIG. 3).

In the case of using the aforementioned tool, a handling operator holds only the handle 3 of the handling tool and does not touch the pellicle directly. Therefore, it is prevented that the pellicle becomes dirty because of the indirect handling by the operator. However, in the case of using the aforementioned conventional tool, it is necessary to insert the insertion pins 7 into the above holes 8. If the locations of the insertion pins 7 are not sufficiently accurate, the insertion pins 7 are not inserted into the said holes 8, and the insertion pins 7 would hit and push the pellicle frame 2. This might cause a problem that the frame 2 is distorted inwardly (FIG. 4) and this distortion produces wrinkles on the pellicle film set on the frame 2. Furthermore, in order to solve this problem, it is required that not only the locations of the holes 8 provided in the pellicle frame 2 but also the locations of the insertion pins 7 provided on the tool should be sufficiently accurate. This was another problem since this pushes up the end-product cost.

In addition, the distance between the holes 8 provided in the pellicle frame 2 is generally 104 mm, which is a constant distance. However, the distance of the holes 8 from the bottom face of the frame might be different depending on the pellicle (FIG. 5). Owing to this fact, it is difficult to insert the insertion pins 7 into the respective holes, and the distortion of the pellicle frame 2 occurs frequently. In such cases, it is necessary to prepare several kinds of handling tools to meet the variously positioned holes, which is troublesome.

PRIOR ART DOCUMENTS

Patent Document

Patent document 1: Japanese Unexamined Patent Publication 2007-292995

SUMMARY OF THE INVENTION

Problem to be Solved by the Invention

As a result of extensive studies, the inventor of the present invention has found that excellent results can be obtained by grasping 4 corners of the pellicle frame with the handling tool, thereby achieving the present invention.

Therefore, the object of the present invention is to provide a handling tool, which does not produce the distortion of the pellicle frame.

Means to Solve the Problem

The above object of the present invention was achieved by a pellicle handling tool for handling a pellicle which is used in the lithography carried out in a manufacturing process of the semiconductor devices, characterized in that the said tool is comprised of a handle, a main shaft connected with the fore-end of the handle to form a T-shaped part, two arms protruding forward from the both ends of the main shaft orthogonally to form a U-shaped part, and 4 pellicle frame holders of which two are each provided on the inward side surface of the said arms respectively, and the said arms have a structure wherein both openable and closable operations from side to side are possible so as to be able to adjust the distance between the arms, and the said holders are provided so that they can grasp the frame side surfaces at 4 corners of the pellicle frame when the said arms are closed.

Effects of the Invention

The handling tool of the present invention holds the 4 corners of the frame without requiring the holes for handling provided conventionally in the pellicle frame. Therefore, distortion of the pellicle frame can be avoided and also since the corners of the pellicle frame are originally hard to deform, the pellicle can be held more firmly. Consequently, easier and more reliable operations are possible than former operations.

MODES FOR CARRYING OUT THE INVENTION

This invention will now be described in more detail referring to specific examples, but the invention is not limited in these examples. The present invention includes articles, which are designed easily by a person skilled in the art based on these examples.

Figure 1:
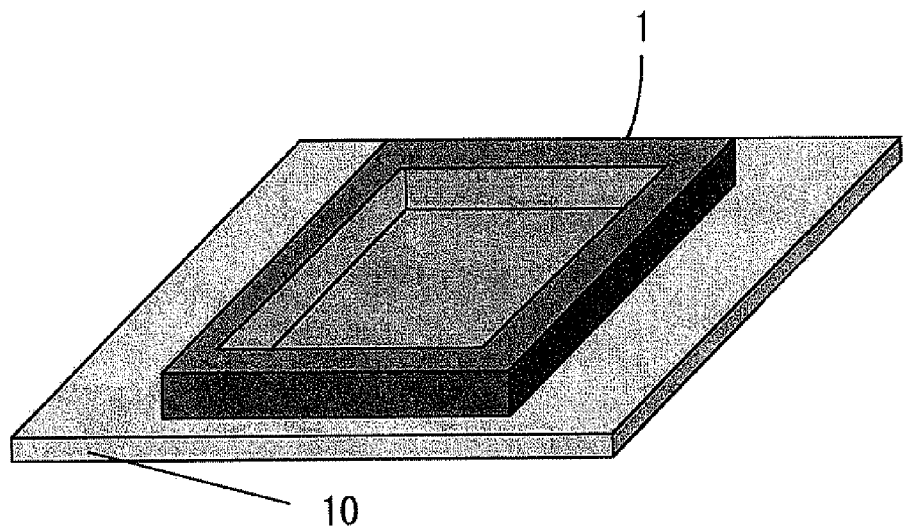
[FIG. 1] An explanation drawing, which shows a state of applying the pellicle to the photo-mask.
Figure 2:
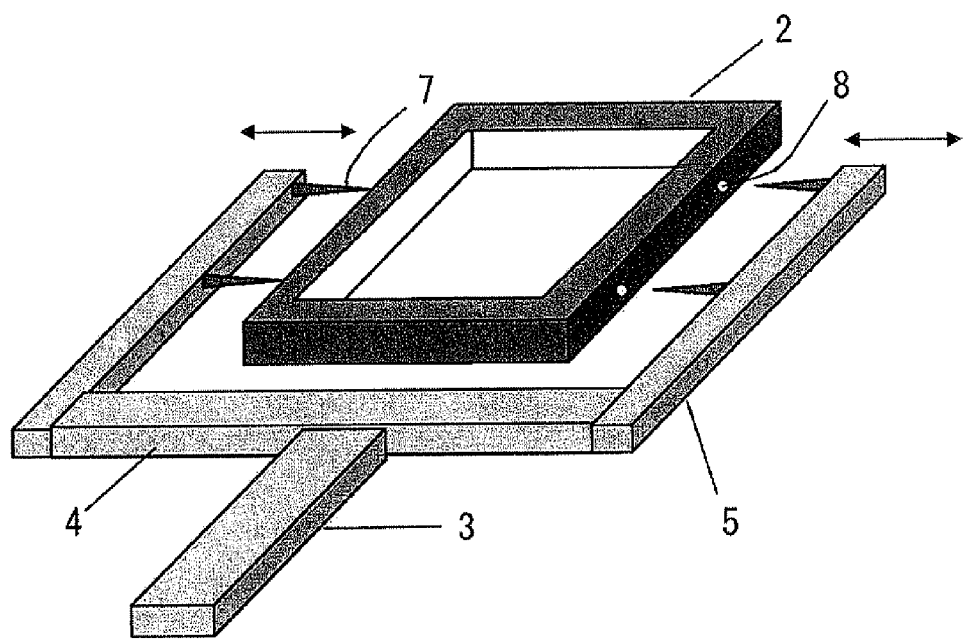
[FIG. 2] An explanation drawing, which explains a relationship between a conventional handling tool and a conventional pellicle frame.
Figure 3:
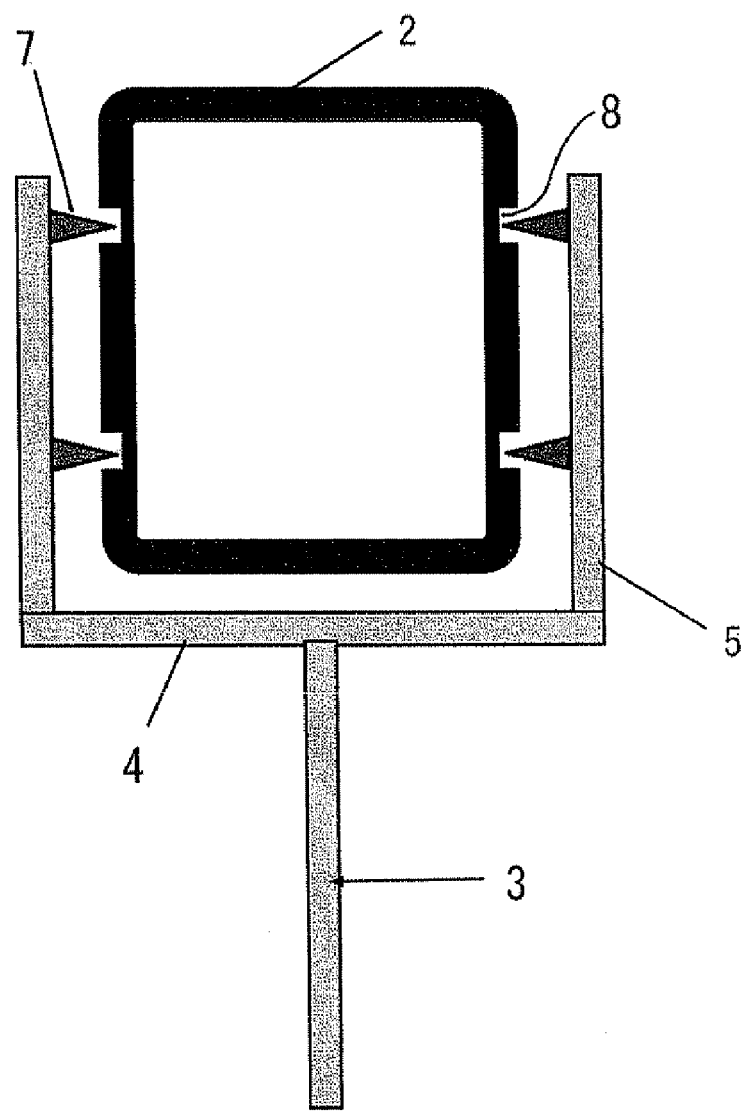
[FIG. 3] A drawing showing a state where the conventional pellicle frame is grasped using the conventional handling tool.
Figure 4:
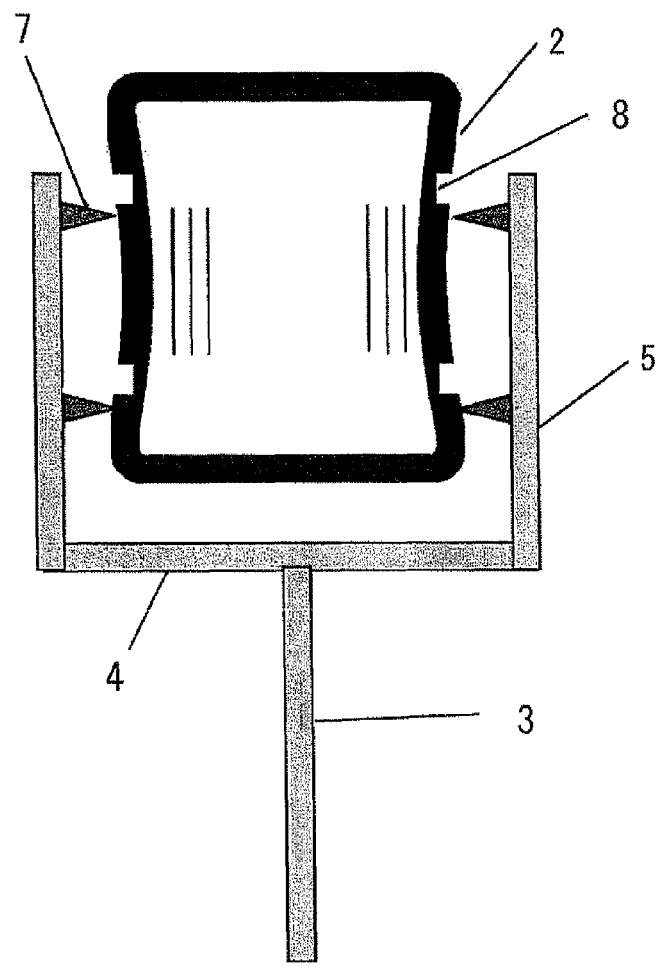
[FIG. 4] A drawing explaining that the pellicle frame is distorted, when insertion pins of the conventional handling tool are not inserted into the holes provided in the conventional pellicle frame.
Figure 5:
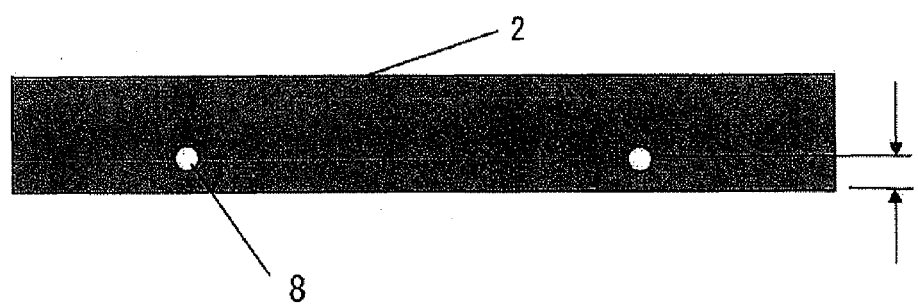
[FIG. 5] A drawing explaining that the distance of the holes provided in the conventional pellicle frame corresponding to the conventional handling tool is irregular.
Figure 6:
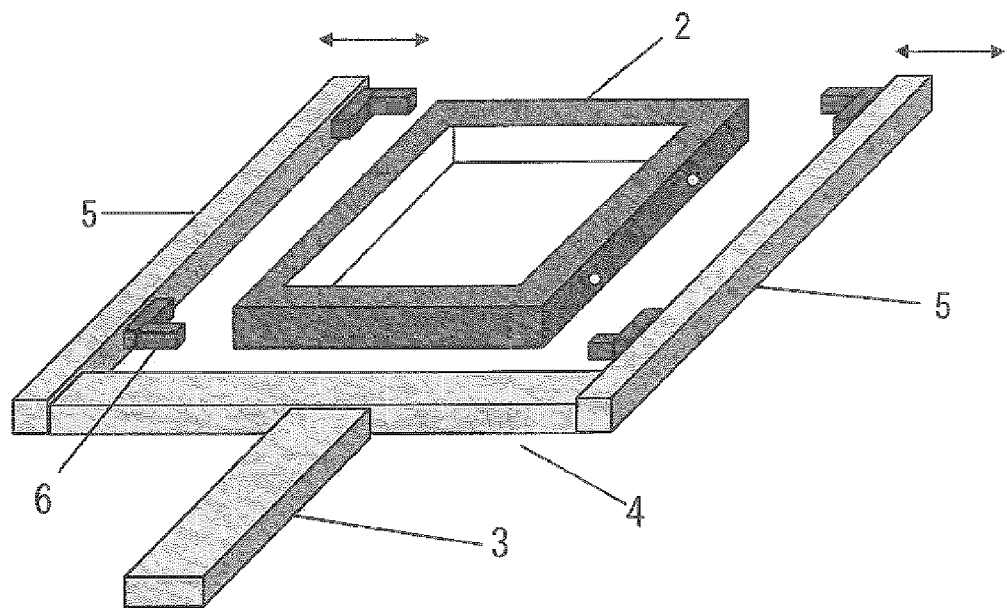
[FIG. 6] A drawing which explains the relationship between the handling tool of the present invention and a pellicle frame.

FIG. 6 is a drawing explaining the relationship between the handling tool of the present invention and the pellicle frame. Herein, numeral 2 is a pellicle frame, numeral 3 is a handle, numeral 4 is a main shaft, numeral 5 are openable and closable arms, numeral 6 are holders. The above arms have a structure wherein they can be opened or closed from side to side by the operation. Shapes of holders can be designed as appropriate. However, a shape, which is able to circle around the corners of the pellicle frame, is preferable so that the pellicle can be held more firmly.

Figure 7:
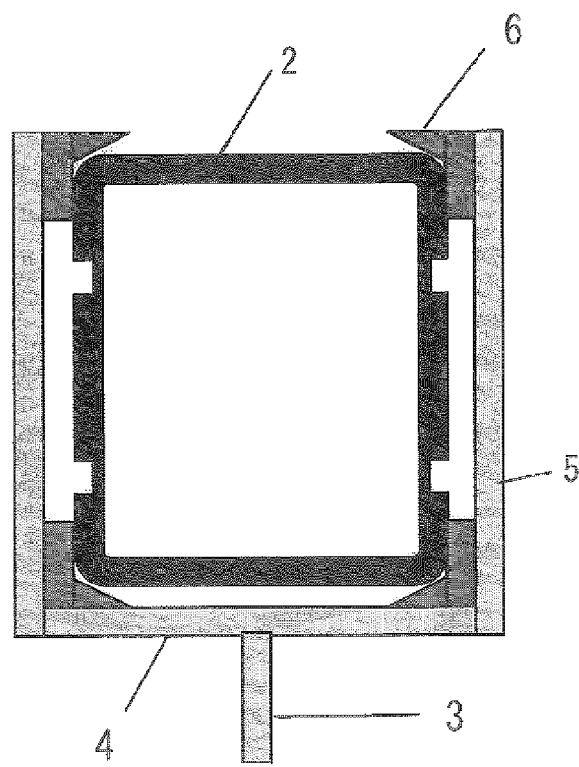
[FIG. 7] A drawing which shows a state where the pellicle frame of the present invention is grasped by the handling tool of the present invention.
Figure 8:
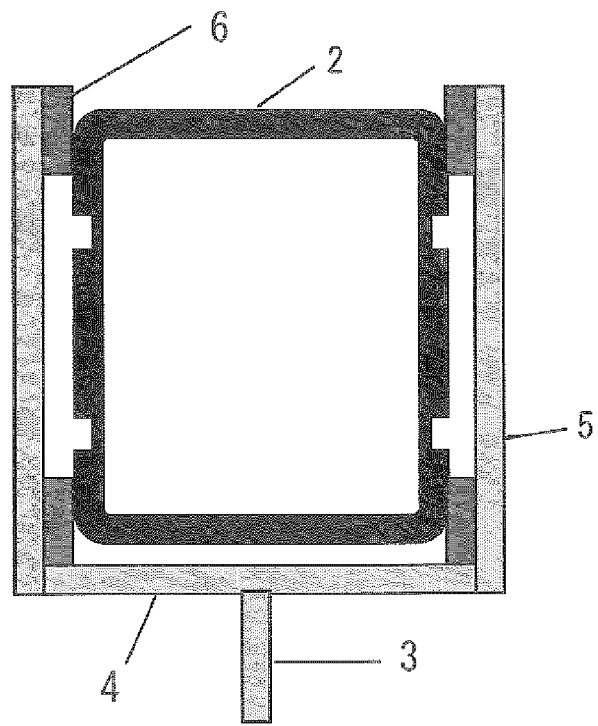
[FIG. 8] A drawing which shows a state where the pellicle frame of the present invention is grasped by another handling tool of the present invention.
Figure 9:
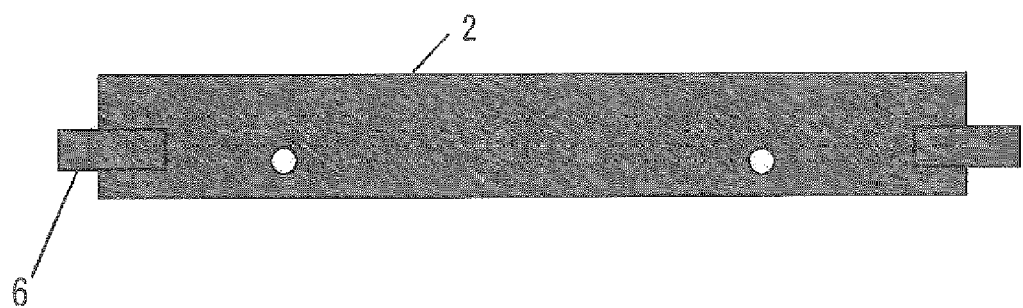
[FIG. 9] A drawing explaining that the distance of the holes provided in the conventional pellicle frame has no influence on the operation when the handling tool of the present invention is used.

In addition, as is shown in FIG. 7, in the case where at least one end of the holders 6 are inclined, a handling becomes easier since the location is fixed when the arms 5 are closed even though the location of the handling tool is not sufficiently accurate during setting. As is shown in FIG. 8, the holders 6 may be mere rectangular shapes.

When the corners of the pellicle frame are held like the present invention, the pellicle can be held without problems even though the locations of each holder is not accurate in the up and down direction. Therefore, workability is enhanced remarkably. Furthermore, since the excessive accuracy is not required against the handling tool, the cost for manufacturing the handling tool can be reduced, therefore, the cost of the final products can also be reduced.

In the handling tool of the present invention, rigidity is required for the handle 3 which is grasped by an operator, the main shaft 4 which is connected with the said handle 3 to be T-shaped and the arm 5 which grasps the pellicle frame 2. Therefore, it is preferable to manufacture the above handle 3, the main shaft 4 and arms 5 using materials such as aluminum and stainless steel. In addition, the holders 6 get in touch with the pellicle frame directly, therefore, it is preferable to make it with materials such as tetrafluoroethylene and high density polyethylene (Vespel: commercial name manufactured by Du Pont Kabushiki Kaisha), which hardly produce foreign substances even if rubbing occurs, or to make with resin/rubber (for example silicone rubber) which has a high friction coefficient so as not to slip.

In particular, it is preferable that the resin having a high friction coefficient is used for the holders 6 which put pressure on the pellicle frame 2, and for the materials used for the part which functions only as a guide when the pellicle is grasped, it is preferable to use a material having a low friction coefficient, which hardly produces foreign substances even if rubbing occurs.

When the handling tool of the present invention is used, after a lid of a pellicle container where the pellicle is put is opened first, the pellicle is grasped using the handling tool of the present invention, then is lifted upward to take out from the container. The pellicle taken out is examined using a condensing lamp in a dark room. If no foreign substances are found on the pellicle film, the pellicle is acceptable. In cases where the handling tool of the present invention is used, foreign substances hardly stick to the pellicle since the pellicle is not grasped by hand directly, and further the pellicle frame is not distorted when the pellicle is grasped. Therefore, a disadvantage of wrinkling on the pellicle film does not occur.

INDUSTRIAL APPLICABILITY

The handling tool of the present invention can be manufactured at a low price since high accuracy is not required. Furthermore, the pellicle frame on its own is inexpensive since there is no need to provide holes in the pellicle frame, and also the pellicle frame can be applied to the photo-mask efficiently since workability is excellent, which is remarkably significant industrially.

EXPLANATIONS OF LETTERS OR NUMERALS

1. Pellicle
2. Pellicle frame
3. Handle
4. Main shaft
5. Arm
6. Holder
7. Insertion pin
8. Hole
10. Photo-mask

What is claimed is:
1. A pellicle handling tool for handling a pellicle which is used in the lithography carried out in a manufacturing process of the semiconductor devices, characterized in that the said tool comprises a handle, a main shaft connected with a fore end of the handle to form a T-shaped part, two parallel arms protruding forward from the both ends of the said main shaft orthogonally to form a U-shaped part, and four pellicle frame holders of which two are each provided on the inward side surface of each arm respectively, and which have such a shape that is capable of circling around each of four corners of the pellicle and which has two faces, a first face being perpendicular to a direction of the arms' movement and a second face forming with said first face an angle greater than 90 degrees and smaller than 180 degrees so as to guide the pellicle frame in sideways direction thereof, the said arms are designed in a manner such that they are both capable of moving towards and away from each other so as to be able to adjust the arm-to-arm distance, and the said holders are provided so that they can grasp the frame's side surfaces at the four corners of the pellicle frame when the said arms are closed.

2. The pellicle handling tool described in claim 1, wherein the said handle and arms are made of aluminum or stainless.

3. The pellicle handling tool described in claim 1, wherein at least a part of the said holders contacting with the pellicle frame is made of materials which hardly produce foreign substance, and/or resin or rubber having a high friction coefficient.

4. The pellicle handling tool described in claim 3, wherein the material of at least the part of the said holders contacting with the pellicle frame is at least one material selected from tetralluoroethylene, high density polyethylene and silicone rubber.

* * * * *